United States Patent
Liu et al.

(10) Patent No.: US 9,129,895 B2
(45) Date of Patent: Sep. 8, 2015

(54) IN SITU REAL-TIME WAFER BREAKAGE DETECTION

(71) Applicant: Taiwan Semiconductor Manufacturing Co., LTD., Hsinchu (TW)

(72) Inventors: Su-Hao Liu, Jhongpu Township, Chiayi County (TW); Chien-Hung Lin, Taichung (TW); Wei-Han Huang, Taipei (TW); Zi-Wei Fang, Baoshan Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 59 days.

(21) Appl. No.: 14/049,464

(22) Filed: Oct. 9, 2013

(65) Prior Publication Data
US 2015/0097676 A1  Apr. 9, 2015

(51) Int. Cl.
G08B 17/00 (2006.01)
H01L 21/66 (2006.01)

(52) U.S. Cl.
CPC .............. *H01L 22/26* (2013.01); *H01L 22/12* (2013.01)

(58) Field of Classification Search
CPC ...... B29C 47/92; G05B 19/048; G05B 19/02; H01L 21/67259
USPC ......... 340/584, 540, 541, 549, 581, 588, 679; 438/10, 147, 565, 799, 680
See application file for complete search history.

(56) References Cited

U.S. PATENT DOCUMENTS

| | | | |
|---|---|---|---|
| 5,759,424 A * | 6/1998 | Imatake et al. | 216/60 |
| 6,065,128 A * | 5/2000 | Harvey | 713/500 |
| 7,326,886 B2 * | 2/2008 | Inoue | 219/444.1 |
| 8,552,409 B2 * | 10/2013 | Kandatsu | 250/492.3 |
| 2013/0260546 A1 * | 10/2013 | Yamada et al. | 438/565 |

\* cited by examiner

*Primary Examiner* — Tai T Nguyen
(74) *Attorney, Agent, or Firm* — Maschoff Brennan

(57) ABSTRACT

The disclosure provides a real-time wafer breakage detection method. The detection method includes the following operations. A wafer is positioned on a wafer holder of a process chamber in which a thermal process is being performed. Then, the temperature at the wafer holder is measured. And, a notification for corrective action is issued if the temperature is out of a predetermined alarm range.

17 Claims, 8 Drawing Sheets

IN SITU REAL-TIME WAFER BREAKAGE DETECTION

TECHNICAL FIELD

The present disclosure relates to a method for wafer breakage detection, and more particularly, to a method for real-time wafer breakage detection.

BACKGROUND

In a microchip fabrication, different processing chambers are used for accomplishing various fabrication operations on a wafer. A processing chamber generally includes a wafer holder on which the wafer is placed. For example, the fabrication operations may be annealing, cleaning, chemical vapor deposition, oxidation, and nitridation.

The wafer may be broken into several pieces due to a higher stress in an annealing tool, and more particularly, in a millisecond (MS) or sub-MS annealing tool. When the wafer breakage occurs, the processing chamber will be contaminated by the pieces of the broken wafer. If the wafer breakage cannot be detected in time, the subsequent wafer will be transferred into the contaminated processing chamber and suffer from particle contamination, or even another wafer breakage issue may occur again. Accordingly, there is a need to provide a real-time wafer breakage detection method.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
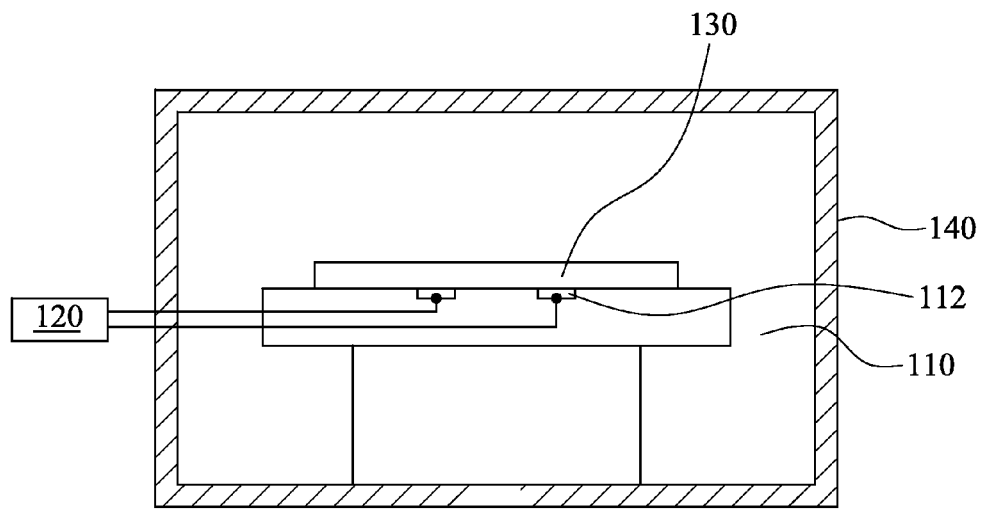
FIG. 1 is a schematic cross-sectional view of a wafer 130 on a wafer holder 110 according to various embodiments of the present disclosure.

The embodiments of a method for wafer breakage detection of the present disclosure are discussed in detail below, but not limited the scope of the present disclosure. The same symbols or numbers are used to the same or similar portion in the drawings or the description. And the applications of the present disclosure are not limited by the following embodiments and examples which the person in the art can apply in the related field.

The singular forms "a," "an" and "the" used herein include plural referents unless the context clearly dictates otherwise. Therefore, reference to, for example, a point of a wafer holder includes embodiments having two or more such point of the wafer holder, unless the context clearly indicates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended; rather, these figures are intended for illustration.

The preferred embodiments disclose methods to provide real-time wafer breakage detection in a process chamber, and to provide a signal of temperature changing at a wafer holder in the process chamber in order to permit corrective actions.

These objects are achieved by measuring the temperature at the wafer holder in the process chamber. When a thermal process is performed in the process chamber, the thermal energy acting on the wafer may stress the wafer inside the chamber, so as to cause wafer breakage. Further, the temperature at the wafer holder may occur a significant changing due to the energy changing in wafer breakage. For example, when the inhomogeneous thermal energy in the wafer is transformed into kinetic energy, the wafer may be broken. At the same time, the temperature at the wafer holder will be decreased and out of a normal temperature range of the wafer holder. Therefore, a temperature sensor coupled to the wafer holder can be used to measure the temperature at the wafer holder. The temperature at the wafer holder is then compared against a predetermined alarm range to issue a notification of corrective action.

FIG. 1 is a schematic cross-sectional view of a wafer 130 on a wafer holder 110 according to various embodiments of the present disclosure. In FIG. 1, the wafer 130 is transferred into a process chamber 140 for fabricating semiconductor devices. The wafer holder 110 has at least one point 112, and the wafer 130 is positioned on the wafer holder 110.

At least one temperature sensor is respectively coupled to the at least one point of the wafer holder. In various embodiments of the present disclosure, a temperature sensor 120 is coupled to the point 112 of the wafer holder 110, as shown in FIG. 1.

Figure 2:
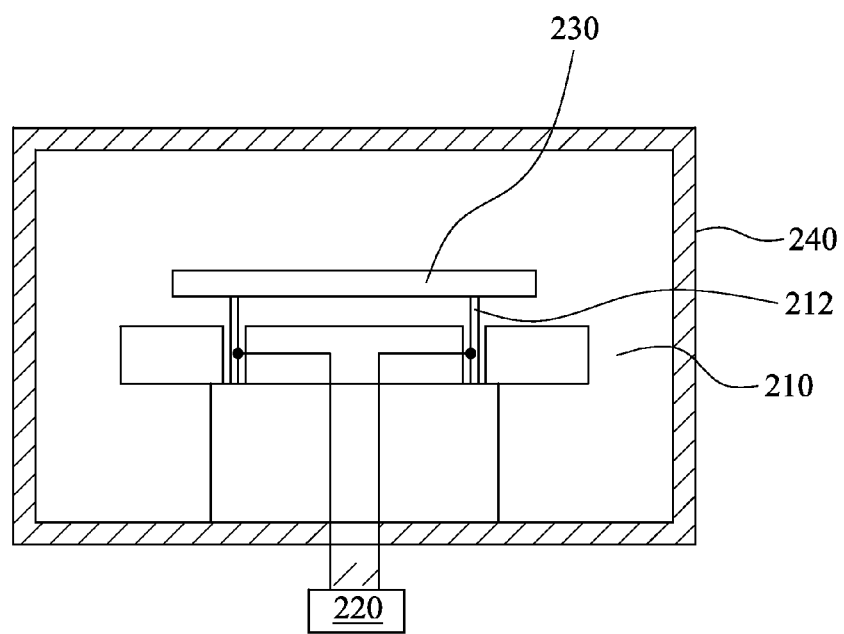
FIG. 2 is a schematic cross-sectional view of a wafer 230 on a wafer holder 210 according to various embodiments of the present disclosure.

FIG. 2 is a schematic cross-sectional view of a wafer 230 on a wafer holder 210 according to various embodiments of the present disclosure.

In FIG. 2, the wafer 230 is transferred into a process chamber 240 for fabricating semiconductor devices. The wafer holder 210 has at least one lift pin 212. The at least one lift pin 212 is used to support the wafer 230.

At least one temperature sensor is respectively coupled to the at least one lift pin of the wafer holder. In various embodiments of the present disclosure, a plurality of temperature sensors 220 are respectively coupled to the lift pins 212 of the wafer holder 210, as shown in FIG. 2.

The at least one temperature sensor is used to measure at least one temperature at the at least one point of the wafer holder. In FIG. 1, the temperature sensor 120 is used to measure the temperature at the point 112 of the wafer holder 110. Referring to FIG. 2, the temperature sensors 220 are used to measure the temperature at the lift pins 212 of the wafer holder 210.

In various embodiments of the present disclosure, the temperature sensor is selected from the group comprising of an infra-red thermometer, a bi-metal mechanical thermometer, an electrical resistance thermometer, a thermocouple thermometer, a Galileo thermometer, a silicon bandgap temperature sensor, a Six's thermometer and a thermistor thermometer.

Figure 3A:
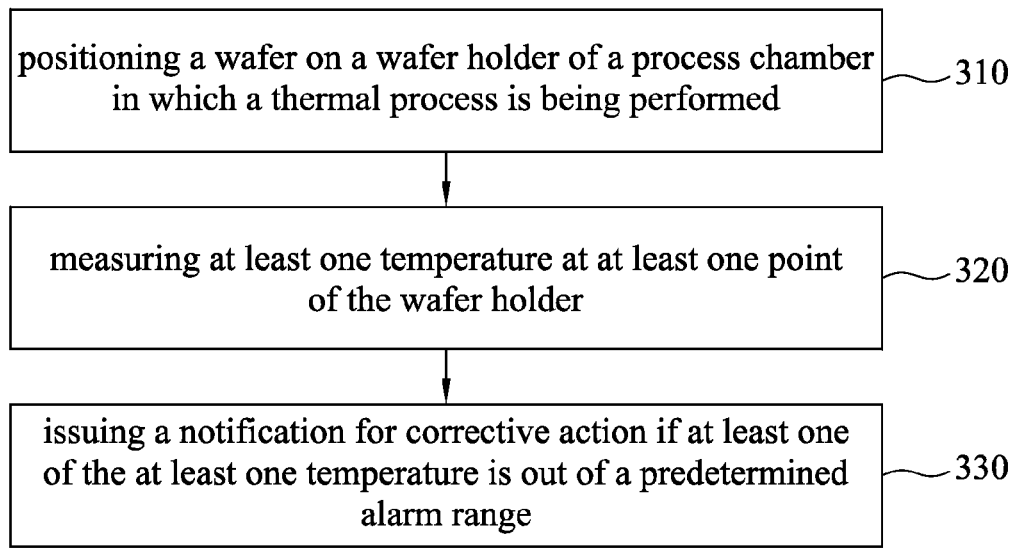
FIGS. 3A-3B are flowcharts illustrating methods for wafer breakage detection according to various embodiments of the present disclosure.

FIG. 3A is a flowchart illustrating methods for wafer breakage detection according to various embodiments of the present disclosure.

In operation 310, a wafer is positioned on a wafer holder of a process chamber in which a thermal process is being performed. In various embodiments of the present disclosure, the thermal process is a rapid thermal annealing process, a millisecond (MS) annealing process or a sub MS annealing process.

Still referring to the operation 320, at least one temperature at at least one point of the wafer holder is measured. The at least one point of the wafer holder contacts the wafer. In various embodiments of the present disclosure, the at least one point of the wafer holder is at least one support point for supporting the wafer. And, in various embodiments of the present disclosure, there is at least one temperature sensor respectively coupled to the at least one point of the wafer holder.

In various embodiments of the present disclosure, the wafer holder further includes at least one lift pin for supporting the wafer. And, the at least one temperature sensor is respectively coupled to the at least one lift pin.

Referring to the operation 330, a notification for corrective action is issued if at least one of the at least one temperature is out of a predetermined alarm range. The predetermined alarm range is determined by temperature measured at a single point of the wafer holder or a shape of a thermal profile. In various embodiments of the present disclosure, the notification for corrective action is audible or visible.

Figure 3B:
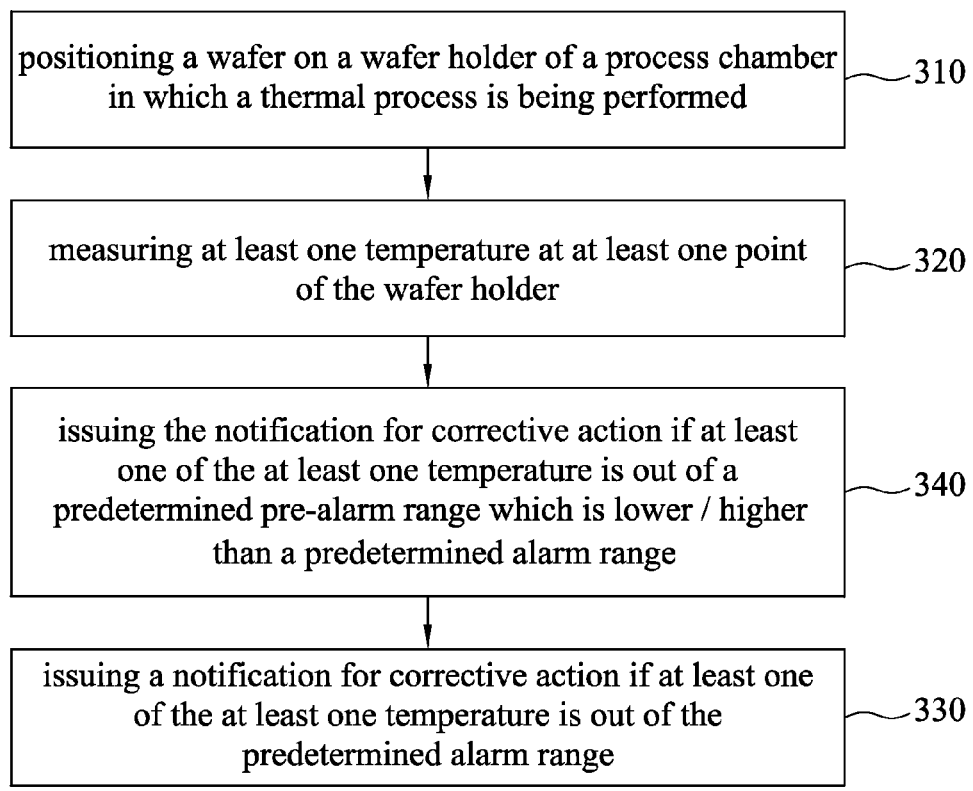

FIG. 3B is a flowchart illustrating methods for wafer breakage detection according to various embodiments of the present disclosure. The flowchart in FIG. 3B is similar to the flowchart in FIG. 3A.

In operation 310, a wafer is positioned on a wafer holder of a process chamber in which a thermal process is being performed. Still referring to the operation 320, at least one temperature at at least one point of the wafer holder is measured. Referring to the operation 330, a notification for corrective action is issued if at least one of the at least one temperature is out of a predetermined alarm range.

Different from the flowchart in FIG. 3A, the flowchart in FIG. 3B further includes an operation 340 between the operations 320 and 330. In the operation 340, a notification for corrective action is issued if the at least one of the at least one temperature is out of a predetermined pre-alarm range. The predetermined pre-alarm range is lower/higher than the predetermined alarm range. In various embodiments of the present disclosure, the predetermined pre-alarm range is 70% of the predetermined alarm range.

Figure 4A:
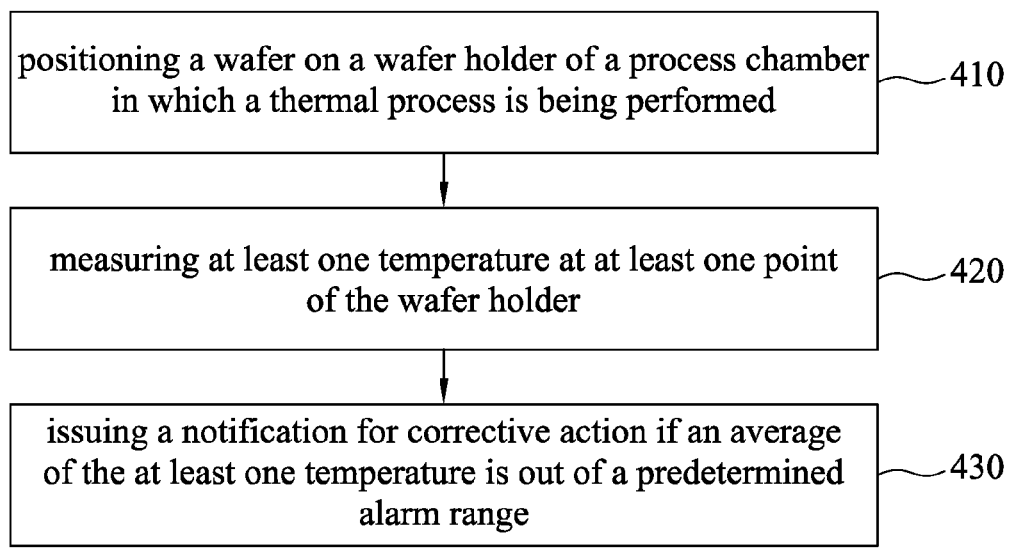
FIGS. 4A-4B are flowcharts illustrating methods for wafer breakage detection according to various embodiments of the present disclosure.

FIG. 4A is a flowchart illustrating methods for wafer breakage detection according to various embodiments of the present disclosure.

In operation 410, a wafer is positioned on a wafer holder of a process chamber in which a thermal process is being performed. In various embodiments of the present disclosure, the thermal process is a rapid thermal annealing process, a millisecond (MS) annealing process or a sub MS annealing process.

Still referring to the operation 420, at least one temperature at at least one point of the wafer holder is measured. The at least one point of the wafer holder contacts the wafer. In various embodiments of the present disclosure, the at least one point of the wafer holder is at least one support point for supporting the wafer. And, in various embodiments of the present disclosure, there is at least one temperature sensor respectively coupled to the at least one point of the wafer holder.

In various embodiments of the present disclosure, the wafer holder further includes at least one lift pin for supporting the wafer. And, the at least one temperature sensor is respectively coupled to the at least one lift pin.

Referring to the operation 430, a notification for corrective action is issued if an average of the at least one temperature is out of a predetermined alarm range. The predetermined alarm range is determined by an average temperature at a plurality of points of the wafer holder or a shape of a thermal profile. In various embodiments of the present disclosure, the notification for corrective action is audible or visible.

In various embodiments of the present disclosure, the notification for corrective action is issued if at least one thermal budget of the wafer holder is out of the predetermined alarm range. The thermal budget defines total amount of thermal energy transferred to the wafer holder during a thermal process. And, the thermal budget of the wafer holder can be calculated by integration of the area in a time/temperature plot.

Figure 4B:
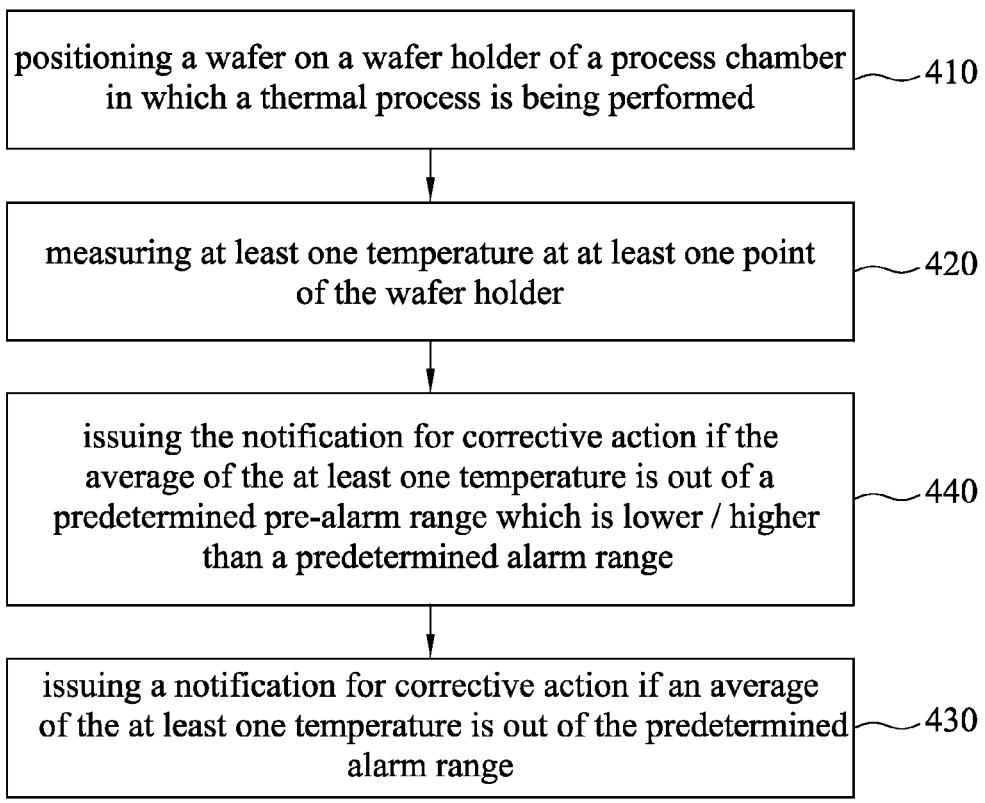

FIG. 4B is a flowchart illustrating methods for wafer breakage detection according to various embodiments of the present disclosure. The flowchart in FIG. 4B is similar to the flowchart in FIG. 4A.

In operation 410, a wafer is positioned on a wafer holder of a process chamber in which a thermal process is being performed. Still referring to the operation 420, at least one temperature at at least one point of the wafer holder is measured. Referring to the operation 430, a notification for corrective action is issued if an average of the at least one temperature is out of a predetermined alarm range.

Different from the flowchart in FIG. 4A, the flowchart in FIG. 4B further includes an operation 440 between the operations 420 and 430. In the operation 440, a notification for corrective action is issued if the average of the at least one temperature is out of a predetermined pre-alarm range. The predetermined pre-alarm range is lower/higher than the predetermined alarm range. In various embodiments of the present disclosure, the predetermined pre-alarm range is 70% of the predetermined alarm range.

Figure 5A:
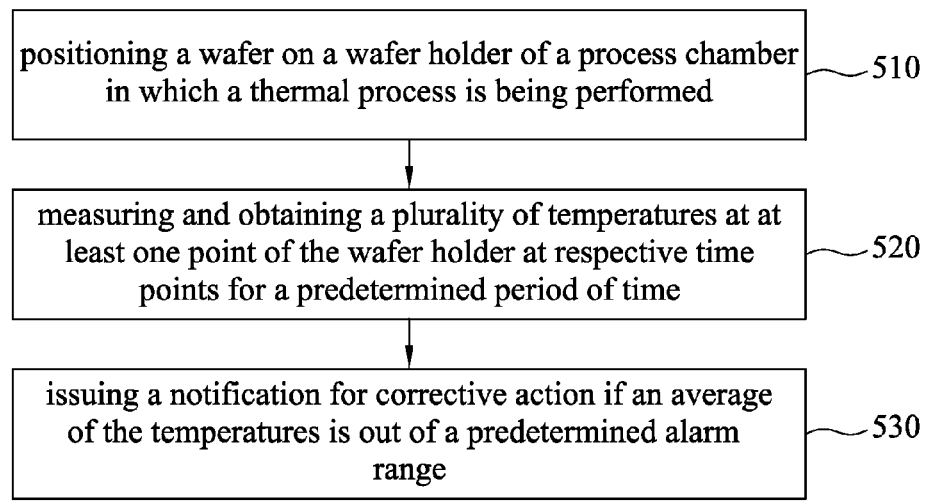
FIGS. 5A-5B are flowcharts illustrating methods for wafer breakage detection according to various embodiments of the present disclosure.

FIG. 5A is a flowchart illustrating methods for wafer breakage detection according to various embodiments of the present disclosure.

In operation 510, a wafer is positioned on a wafer holder of a process chamber in which a thermal process is being performed. In various embodiments of the present disclosure, the thermal process is a rapid thermal annealing process, a millisecond (MS) annealing process or a sub MS annealing process.

Still referring to the operation 520, a plurality of temperatures at at least one point of the wafer holder is measured and obtained at respective time points for a predetermined period of time. The at least one point of the wafer holder contacts the wafer. In various embodiments of the present disclosure, the at least one point of the wafer holder is at least one support point for supporting the wafer. And, in various embodiments of the present disclosure, there is at least one temperature sensor respectively coupled to the at least one point of the wafer holder.

In various embodiments of the present disclosure, the wafer holder further includes at least one lift pin for supporting the wafer. And, the at least one temperature sensor is respectively coupled to the at least one lift pin.

Referring to the operation 530, a notification for corrective action is issued if an average of the temperatures is out of a predetermined alarm range. The predetermined alarm range is determined by an average temperature at a plurality of points of the wafer holder or a shape of a thermal profile. In various embodiments of the present disclosure, the notification for corrective action is audible or visible.

In various embodiments of the present disclosure, the notification for corrective action is issued if at least one thermal budget of the wafer holder is out of the predetermined alarm range. And, the thermal budget of the wafer holder can be calculated by integration of the area in a time/temperature plot.

Figure 5B:
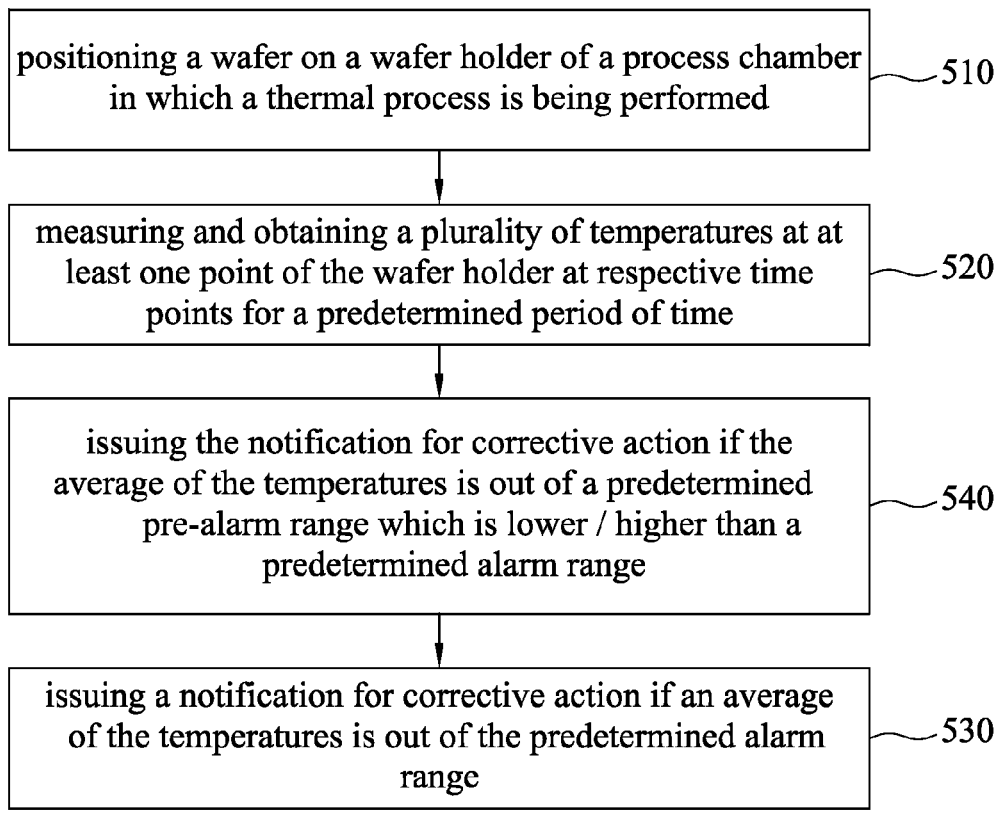

FIG. 5B is a flowchart illustrating methods for wafer breakage detection according to various embodiments of the present disclosure. The flowchart in FIG. 5B is similar to the flowchart in FIG. 5A.

In operation 510, a wafer is positioned on a wafer holder of a process chamber in which a thermal process is being performed. Still referring to the operation 520, a plurality of temperatures at at least one point of the wafer holder is measured and obtained at respective time points for a predetermined period of time. Referring to the operation 530, a notification for corrective action is issued if an average of the temperatures is out of a predetermined alarm range.

Different from the flowchart in FIG. 5A, the flowchart in FIG. 5B further includes an operation 540 between the operations 520 and 530. In the operation 540, a notification for corrective action is issued if the average of the temperatures is out of a predetermined pre-alarm range. The predetermined pre-alarm range is lower/higher than the predetermined alarm range. In various embodiments of the present disclosure, the predetermined pre-alarm range is 70% of the predetermined alarm range.

Figure 6:
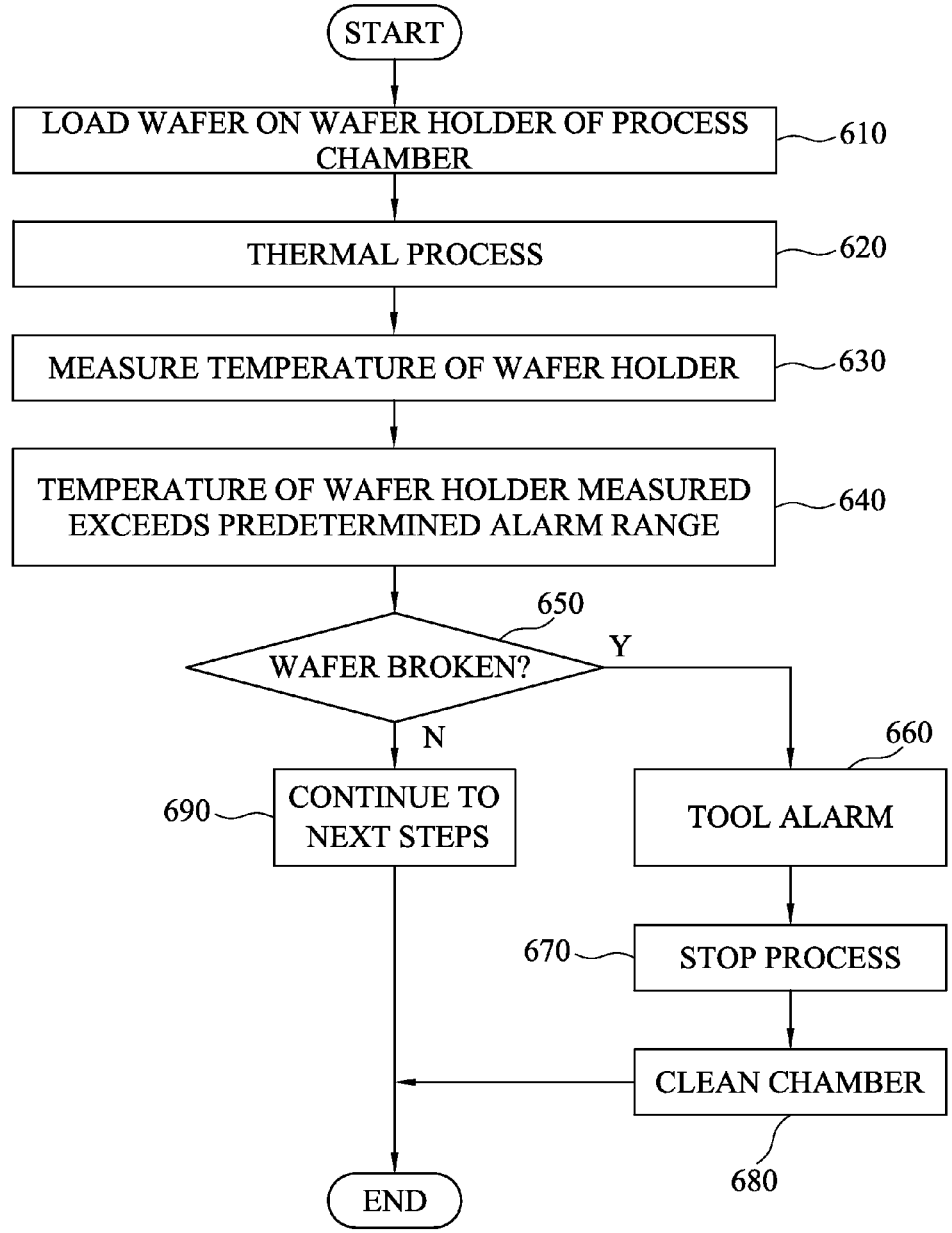
FIG. 6 is a flowchart illustrating a method for operating wafer breakage detection according to various embodiments of the present disclosure.

FIG. 6 is a flowchart illustrating a method for operating wafer breakage detection according to various embodiments of the present disclosure.

First with reference to operation 610, a wafer is robotically loaded into a process chamber. A thermal process is being performed in the process chamber at operation 620. The temperature of the wafer holder is measured at operation 630. If the temperature of the wafer holder measured exceeds predetermined alarm range at operation 640, a determination is performed at operation 650 whether the wafer is broken. When the wafer breakage is occurred (path Y), the tool is alarmed at operation 660. Then, the whole process is stopped at operation 670. Final, the broken wafer is removed, and the chamber cleaning is performed at operation 680. On the other way, if the wafer breakage is not occurred (path N), the process will be continued to the next steps at operation 690.

By the methods provided in various embodiments of the present disclosure, the wafer breakage can be detected in time, and then the subsequent wafer will not be transferred into the contaminated processing chamber. Therefore, the subsequent wafer can be blocked to prevent particle contamination or wafer breakage.

Although embodiments of the present disclosure and their advantages have been described in detail, they are not used to limit the present disclosure. It should be understood that various changes, substitutions and alterations can be made herein without departing from the spirit and scope of the present disclosure. Therefore, the protecting scope of the present disclosure should be defined as the following claims.

What is claimed is:

1. A real-time wafer breakage detection method, comprising:
   positioning a wafer on a wafer holder of a process chamber in which a thermal process is being performed;
   measuring a temperature at a point of the wafer holder, which is performed using at least one temperature sensor respectively coupled to at least one lift pin of the wafer holder supporting the wafer; and
   issuing a notification for corrective action if the temperature is out of a predetermined alarm range.

2. The method of claim 1, wherein the at least one point of the wafer holder contacts the wafer.

3. The method of claim 1, wherein measuring the temperature at the point of the wafer holder is performed using the at least one temperature sensor respectively coupled to the point of the wafer holder.

4. The method of the claim 1, further comprising:
   issuing the notification for corrective action if the at least one of the at least one temperature is out of a predetermined pre-alarm range which is lower/higher than the predetermined alarm range.

5. The method of the claim 4, wherein the predetermined pre-alarm range is 70% of the predetermined alarm range.

6. A real-time wafer breakage detection method, comprising:
   positioning a wafer on a wafer holder of a process chamber in which a thermal process is being performed;
   measuring at least one temperature at a point of the wafer holder, which is performed using at least one temperature sensor respectively coupled to at least one lift pin of the wafer holder supporting the wafer; and
   issuing a notification for corrective action if an average of the at least one temperature is out of a predetermined alarm range.

7. The method of claim 6, wherein the at least one point of the wafer holder contacts the wafer.

8. The method of claim 6, wherein measuring the temperature at the point of the wafer holder is performed using the at least one temperature sensor respectively coupled to the at least one point of the wafer holder.

9. The method of the claim 6, further comprising:
   issuing the notification for corrective action if the average of the at least one temperature is out of a predetermined pre-alarm range which is lower/higher than the predetermined alarm range.

10. The method of the claim 9, wherein the predetermined pre-alarm range is 70% of the predetermined alarm range.

11. The method of the claim 6, further comprising:
    issuing the notification for corrective action if at least one thermal budget of the wafer holder is out of the predetermined alarm range.

12. A real-time wafer breakage detection method, comprising:
    positioning a wafer on a wafer holder of a process chamber in which a thermal process is being performed;
    measuring and obtaining a plurality of temperatures at a point of the wafer holder at respective time points for a predetermined period of time, which is performed using at least one temperature sensor respectively coupled to at least one lift pin of the wafer holder supporting the wafer; and
    issuing a notification for corrective action if an average of the temperatures is out of the predetermined alarm range.

13. The method of claim 12, wherein the at least one point of the wafer holder contacts the wafer.

14. The method of claim 12, wherein measuring the temperatures at the point of the wafer holder at respective time points for the predetermined period of time is performed using the at least one temperature sensor respectively coupled to the at least one point of the wafer holder.

15. The method of the claim 12, further comprising:
issuing the notification for corrective action if the average of the temperatures is out of the predetermined pre-alarm range which is lower/higher than the predetermined alarm range.

16. The method of the claim 15, wherein the predetermined pre-alarm range is 70% of the predetermined alarm range.

17. The method of the claim 12, further comprising:
issuing the notification for corrective action if at least one thermal budget of the wafer holder is out of the predetermined alarm range.

* * * * *